United States Patent [19]

Monden

[11] Patent Number: 5,047,984
[45] Date of Patent: Sep. 10, 1991

[54] INTERNAL SYNCHRONOUS STATIC RAM

[75] Inventor: Junji Monden, Tokyo, Japan

[73] Assignee: NEC Corporation, Tokyo, Japan

[21] Appl. No.: 520,943

[22] Filed: May 9, 1990

[30] Foreign Application Priority Data

May 9, 1989 [JP] Japan ................... 1-116308

[51] Int. Cl.$^5$ .......................... G11C 7/00; G11C 11/4
[52] U.S. Cl. .................................. 365/203; 365/233; 365/233.5; 365/189.08; 365/191
[58] Field of Search .............. 365/203, 189.08, 189.06, 365/191, 233, 233.5

[56] References Cited

U.S. PATENT DOCUMENTS 4,751,683 6/1988 Wada et al. ...................... 365/233.5

Primary Examiner—Alyssa H. Bowler
Attorney, Agent, or Firm—Sughrue, Mion, Zinn, Macpeak & Seas

[57] ABSTRACT

An internal synchronous SRAM comprises an SRAM cell array having a number of SRAM cells arranged in the form of a matrix, a precharge circuit connected to all bit lines of the SRAM cell array for precharging the bit lines in response to a bit line precharge signal, a selector connected to all the bit lines and responding to a bit line select signal for connecting only a selected pair of bit lines to a pair of common data lines, a pull-down circuit connected to the pair of common data lines and for pulling down the common data lines in response to a pull-down control signal and a sense amplifier connected to the common data lines for amplifying a data signal appearing on the common data lines. In addition, an address transition detector is connected to receive an address signal for generating an internal synchronous signal in response to transition of the address signal, and a control pulse generator is connected to receive the internal synchronous signal and operating to generate the pull-down control signal and the bit line precharge signal in response to the internal synchronous signal.

2 Claims, 4 Drawing Sheets

INTERNAL SYNCHRONOUS STATIC RAM

BACKGROUND OF THE INVENTION

1. Field of the Invention

The present invention relates to an internal synchronous type of static RAM (random access memory) (the static RAM will be called "SRAM" in the specification), and more specifically to an internal synchronous SRAM having a precharge circuit and a pull-down circuit.

2. Description of Related Art

In general, the internal synchronous SRAM comprises an SRAM cell array having a number of SRAM cells arranged in the form of a matrix, a plurality of row or word lines and a plurality of pairs of column or bit lines. One SRAM cell is located at each intersection between each word line and each pair of bit lines. A precharge circuit is connected to all the bit lines so as to precharge the bit lines. In addition, a selector is connected to all the bit lines so as to connect only a selected pair of bit lines to a common data bus. A pull-down circuit is connected to the common data bus.

In operation, before data is read from or written into a selected SRAM cell, the bit lines are precharged by means of the precharge circuit, and at the same time, the common data bus is pulled down by the pull-down circuit. In the case that a voltage supply voltage varies, the common data bus is often maintained at a high potential which prevents turn-on of the selector. The pull-down circuit is provided to prevent the common data bus from being maintained at a high potential which prevents turn-on of the selector, regardless of variation of a voltage supply voltage. However, since the common data bus is connected to the bit lines through the selector, if the voltage supply voltage does not vary almost, the bit lines is caused to drop to a level further lower than a level sufficient to permit a quick turn-on of the selector. This excessive drop of the bit line potential is apt to break the data of the SRAM cells. This is contrary to the object of the precharge, namely the prevention of break of data stored in SRAM cells.

In general, if the potential of the bit lines drops to a half or less of a voltage supply voltage, the data of the SRAM cells is easily broken. This inclination becomes remarkable in the case that the voltage supply voltage itself is low.

SUMMARY OF THE INVENTION

Accordingly, it is an object of the present invention to provide an internal synchronous SRAM which has overcome the above mentioned defect of the conventional one.

Another object of the present invention is to provide an internal synchronous SRAM capable of preventing break of data of memory cells even if a voltage supply voltage drops.

The above and other object of the present invention are achieved in accordance with the present invention by an internal synchronous SRAM comprising:

an address transition detector connected to receive an address signal for generating an internal synchronous signal in response to transition of the address signal;

a control pulse generator connected to receive the internal synchronous signal and operating to generate a pull-down control signal and a bit line precharge signal in response to the internal synchronous signal, the pull-down control signal having a predetermined pulse width and having a tailing edge before a rising of a word line selecting signal, and the bit line precharge signal having a leading edge substantially concurrent with a leading edge of the pull-down control signal and a tailing edge after the tailing edge of the pull-down control signal but before the rising of the word line selecting signal;

an SRAM cell array having a number of SRAM cells arranged in the form of a matrix, a plurality of word lines and a plurality of pairs of bit lines, one SRAM cell being located at each intersection between each word line and each pair of bit lines, each of the word lines being connected to receive a corresponding word line select signal;

a precharge circuit connected to all the bit lines and a voltage supply voltage and for precharging the bit lines in response to the bit line precharge signal during an active period of the bit line precharge signal;

a selector connected to all bit lines and receiving a bit line select signal for connecting only a selected pair of bit lines to a pair of common data lines;

a pull-down circuit connected to the pair of common data lines and for pulling down the common data lines in response to the pull-down control signal during an active period of the pull-down control signal; and a sense amplifier connected to the common data lines for amplifying a data signal appearing on the common data lines.

With the above mentioned arrangement, the bit lines are precharged at substantially the same time as the common data lines are pulled down, and continuously precharged after completion of the pull-down of the common data lines, and the precharge of the bit lines is completed before the rising of the word line select signal.

The above and other objects, features and advantages of the present invention will be apparent from the following description of preferred embodiments of the invention with reference to the accompanying drawings.

DESCRIPTION OF THE PREFERRED EMBODIMENT

Figure 1:
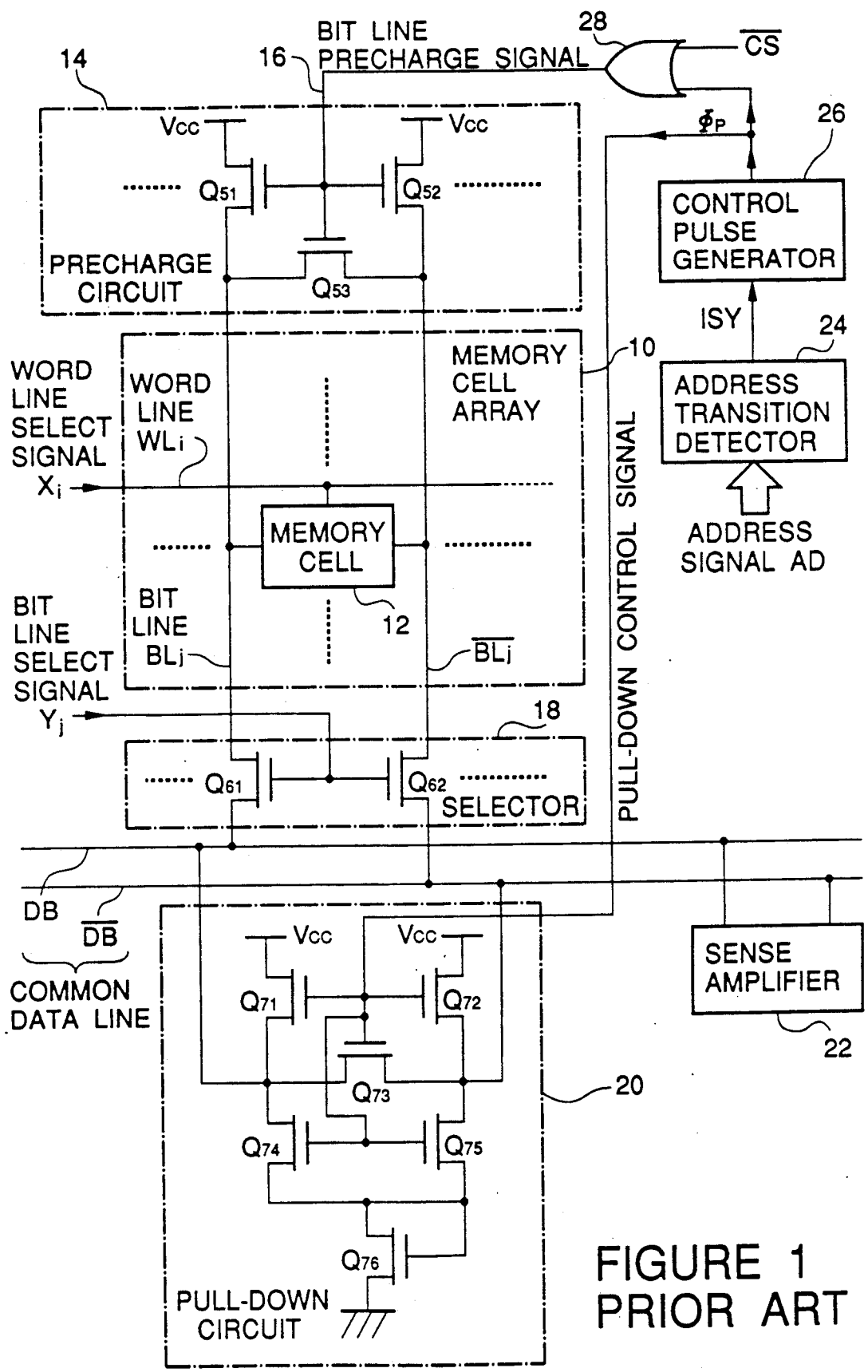
FIG. 1 is a block diagram of a typical example of a conventional internal synchronous SRAM.

Referring to FIG. 1, there is shown a block diagram of a typical example of a conventional internal synchronous SRAM. The SRAM includes a number of SRAM cells. However, only one SRAM cell and its associated circuits will be shown in the drawings and explained in the specification for simplification of description.

The shown SRAM includes a memory cell array 10 which is composed of a number of SRAM cells arranged in the form of a matrix having a plurality of rows and a plurality of columns. However, only one of the SRAM cells is shown for simplification of drawing and designated by Reference Numeral 12. In addition, the memory cell array 10 includes a plurality of word lines $WL_i$ and a plurality of pairs of bit lines $BL_j$ and $\overline{BL_j}$, the word lines $WL_i$ intersecting with the bit lines $BL_j$ and $\overline{BL_j}$. But, also for simplification of drawing, only one word line $WL_i$ and only one pair of bit lines $BL_j$ and $\overline{BL_j}$ are shown. Each of the word lines $WL_i$ is connected to all SRAM cells arranged in the same and correspoding row of the matrix and also connected to receive a corresponding word line selecting signal Xi outputted from an X-decoder or row decoder (not shown), and each pair of bit lines $BL_j$ and $\overline{BL_j}$ are connected to all SRAM cells arranged in the same and corresponding column of the matrix, so that each of SRAM cells connected to a word line WLi receiving a high level word line selecting signal Xi is connected to an associated pair of bit lines $BL_j$ and $\overline{BL_j}$.

Since an internal structure of the SRAM cell and a construction of the memory cell array are well known to persons skilled in the art, a detailed description will be omitted.

In the shown SRAM, the SRAM cell 12 is connected to one word line $WL_i$ and to one pair of bit lines $BL_j$ and $\overline{BL_j}$. The pair of bit lines $BL_j$ and $\overline{BL_j}$ are connected to a precharge circuit 14, which includes a MOSFET (metal oxide semiconductor filed effect transistor) $Q_{51}$ connected between the bit line $BL_j$ and a high voltage supply voltage Vcc, another MOSFET $Q_{52}$ connected between the bit line $\overline{BL_j}$ and the high voltage supply voltage Vcc, and a third MOSFET $Q_{53}$ connected between the pair of bit lines $BL_j$ and $\overline{BL_j}$. Gates of these MOSFETs $Q_{51}$, $Q_{52}$ and $Q_{53}$ are commonly connected to a bit line precharge signal line 16.

Furthermore, the pair of bit lines $BL_j$ and $\overline{BL_j}$ are connected to a selector 18, which includes a MOSFET $Q_{61}$ connected between the bit line $BL_j$ and a common data line DB, and another MOSFET $Q_{62}$ connected between the bit line $\overline{BL_j}$ and a complementary common data line $\overline{DB}$. Gates of these MOSFETs $Q_{61}$ AND $Q_{62}$ are commonly connected to receive a corresponding bit line selecting signal $Y_j$ outputted from a Y-decoder or column decoder (not shown). Therefore, the selector 18 operates to connect a pair of bit line $BL_j$ and $\overline{BL_j}$ selected by the bit line selecting signal $Y_j$, to the pair of common data lines DB and $\overline{DB}$, respectively.

The pair of common data lines DB and $\overline{DB}$ are connected to a pull-down circuit 20, and a sense amplifier 22 for amplifying a data signal appearing on the pair of common data lines DB and $\overline{DB}$. The pull-down circuit 20 includes a MOSFET $Q_{71}$ connected between the common data line DB and the high voltage supply voltage Vcc, another MOSFET $Q_{72}$ connected between the common data line $\overline{DB}$ and the high voltage supply voltage Vcc, and a third MOSFET $Q_{33}$ connected between the pair of common data lines DB and $\overline{DB}$. The pull-down circuit 20 also includes a fourth MOSFET $Q_{74}$ connected at its one end to the common data line DB and a fifth MOSFET $Q_{75}$ connected at its one end to the common data line $\overline{DB}$. The other ends of the MOSFETs $Q_{74}$ and $Q_{75}$ are connected to each other and grounded through a sixth MOSFET $Q_{76}$ connected in the form of an active load. In addition, gates of the first to fifth MOSFETs $Q_{71}$, $Q_{72}$, $Q_{73}$, $Q_{74}$ and $Q_{75}$ are connected to each other so as to receive the same signal. Here, all of the MOSFETs $Q_{51}$, $Q_{52}$, $Q_{53}$, $Q_{61}$, $Q_{62}$, $Q_{71}$, $Q_{72}$, $Q_{73}$, $Q_{74}$ and $Q_{75}$ are of the N-channel type.

The shown SRAM also includes an address transition detector 24 connected to receive all bits of an address signal AD in parallel in order to detect a transition of the address signal AD. When the transition of the address signal AD is detected, the address transition between 24 generates an internal synchronous signal ISY, which is in turn supplied to an control pulse generator 26. This control pulse generator 26 responds to the internal synchronous signal ISY so as to generate an control pulse $\phi p$ which has a predetermined pulse width and which terminates before the word line selecting signal Xi starts to rise up. This control pulse $\phi p$ is supplied to the commonly connected gates of the first to fifth MOSFETs $Q_{71}$, $Q_{72}$, $Q_{73}$, $Q_{74}$ and $Q_{75}$ of the pull-down circuit 24. Further, the control pulse $\phi p$ is supplied to an OR gate 28, which also receives a chip select signal $\overline{CS}$ of an active low type. An output of the OR gate 28 is connected to the bit line precharge signal line 16.

An internal structure of each of the sense amplifier 22, the address transition detector 24 and the control pulse generator 26 are well known to persons skilled in the art, and therefore, a detailed description will be omitted.

With the above mentioned arrangement, the precharge circuit 14 operates to precharge the pair of bit lines $BL_j$ and $\overline{BL_j}$ to the same potential during a period corresponding to the pulse width of the control pulse $\phi p$, or when the chip select signal $\overline{CS}$ is at a high level, and the pull/down circuit 20 operates to pull down the pair of common data lines DB and $\overline{DB}$ to a predetermined potential during the period corresponding to the pulse width of the control pulse $\phi p$.

Now, operation of the circuit shown in FIG. 1 will be explained with reference to FIG. 2 which illustrates waveforms on various points of the circuit shown in FIG. 1.

Figure 2:
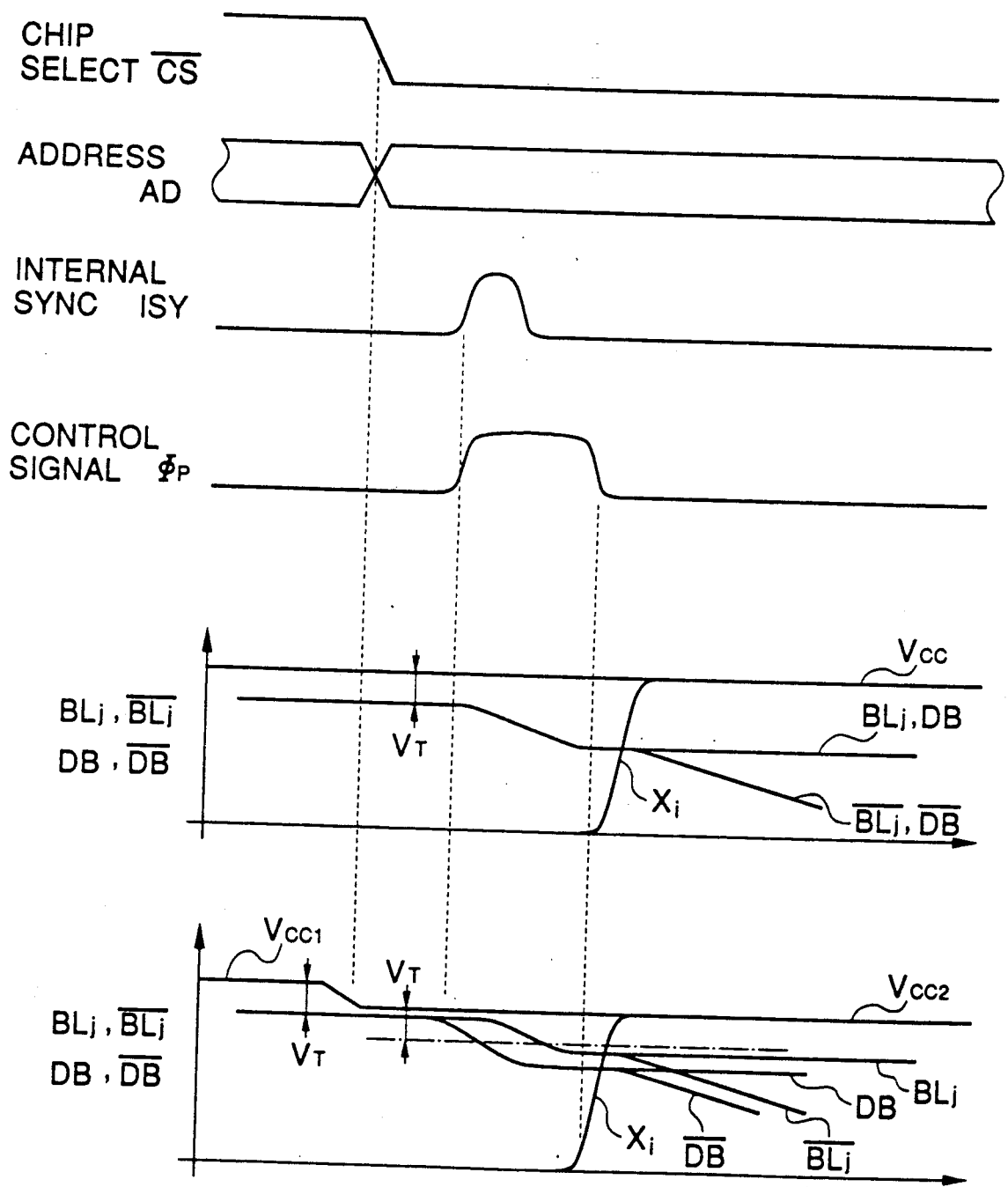
FIG. 2 is a waveform diagram illustrating an operation of the internal synchronous SRAM shown in FIG. 1.

As shown in FIG. 2, the internal synchronous signal ISY is generated by the address transition detector 24 in response to transition of the address signal AD, and the control pulse $\phi p$ is generated by the control pulse generator 26 in response to the internal synchronous signal ISY. The control signal $\phi p$ is brought to a high level for a predetermined period of time after the transition of the address signal AD but before the word line selecting signal Xi is brought to a high level. The word line selecting signal Xi is also generated on the basis of the address signal AD by a circuit not shown. Since the control signal $\phi p$ is applied through the OR gate 28 to the precharge circuit 14, the high level of the control signal $\phi p$ turns on all the transistor $Q_{51}$, $Q_{52}$ and $Q_{53}$ of the precharge circuit 14. Therefore, the high level control signal $\phi p$ ensures that each pair of bit lines $BL_j$ and $\overline{BL_j}$ are previously brought to the same predetermined potential, in order to prevent data stored in a SRAM cell connected to a word line WLi to be next newly selected, from being broken by data which has been read or written in a preceding cycle.

The precharge circuit 14 receives not only the control signal $\phi p$ but also the chip select signal $\overline{CS}$, and therefore, each pair of bit lines BLj and $\overline{BLj}$ are precharge when a chip is in a non-selected condition (high level $\overline{CS}$) and for the predetermined period of time after each transition of the address signal when the chip is in a selected condition (low level $\overline{CS}$).

As seen from FIG. 2, the word line selecting signal Xi is brought to a high level after the precharge of the bit lines BLj and $\overline{BLj}$ performed after the transition of the address signal AD has been completed. Thus, data stored in each of SRAM cells connected to a word line WLi receiving the high level of work line selecting signal Xi is transferred to a corresponding pair of bit line BLj and $\overline{BLj}$.

On the other hand, the bit line selecting signal Yj is supplied to the selector 18, so that only a pair of bit lines BLj and $\overline{BLj}$ corresponding to the address signal AD are selected and connected to the common data lines DB and $\overline{DB}$.

The control signal $\phi p$ is applied to the pull-down circuit 20 as a pull-down control signal, so that the common data lines DB and $\overline{DB}$ are pulled down at the same time that the bit lines BLj and $\overline{BLj}$ are precharged, and therefore, elevation of the potential of the bit lines BLj and $\overline{BLj}$ is suppressed through the selector circuit 18 by action of the pull-down circuit 20.

After the completion of the precharge period, the word line selecting signal Xi is brought to the high level, so that the data stored in each of the SRAM cells connected to the high level word line XLi is transferred to the associated pair of bit lines BLj and $\overline{BLj}$, and only the data on a pair of bit lines BLj and $\overline{BLj}$ selected by the bit line selecting signal Yj is transferred to the common data lines DB and $\overline{DB}$ through the selector 18. The data transferred on the common data lines DB and $\overline{DB}$ is amplified by the sense amplifier 22, and outputted to an external through an output terminal (not shown). With this reading operation is completed.

The above mentioned pull-down of the bit lines BLj and e,ovs/BLj/ and the data lines DB and $\overline{DB}$ will become effective under a certain situation explained below.

Here, assume that the voltage supply voltage Vcc is $Vcc_1$ in a just preceding cycle and $Vcc_2$ in a current cycle, and $Vcc_1 > Vcc_2$.

In the just preceding cycle, if the chip select signal $\overline{CS}$ is at a high level so as to maintain the SRAM in a standby condition, the precharge circuit 14 operates to bring the bit lines BLj and $\overline{BLj}$, and the common data lines DB and $\overline{DB}$ through the selector circuit 18, to a potential of $\{Vcc_1 - V_T\}$, where $V_T$ is a threshold of the transistors $Q_{51}$, $Q_{52}$, $Q_{61}$ and $Q_{62}$.

Thereafter, when the voltage supply voltage Vcc drops from $Vcc_1$ to $Vcc_2$, all of the transistors $Q_{51}$, $Q_{52}$, $Q_{61}$ and $Q_{62}$ are turned off, so that the bit lines BLj and $\overline{BLj}$ and the common data lines DB and $\overline{DB}$ are brought into a floating condition. Namely, the bit lines BLj and $\overline{BLj}$, and the common data lines DB and $\overline{DB}$ are maintained at the potential of $\{Vcc_1 - V_T\}$.

In this condition, unless the bit lines BLj and $\overline{BLj}$ or the common data lines DB and $\overline{DB}$ drops to a potential of $\{Vcc_2 - V_T\}$, the transistors $Q_{61}$ and $Q_{62}$ will not be turned on. Therefore, if the pull-down circuit 20 were not provided, when the potential of the bit lines BLj and $\overline{BLj}$ has dropped to the potential of $\{Vcc_2 - V_T\}$ by action of data stored in a selected SRAM cell, the data is firstly transferred to the common data lines DB and $\overline{DB}$. This is a cause for delay in access and reading malfunction.

The pull-down circuit 20 is effective in preventing the above drawbacks. The pull-down circuit 20 operates to forcibly lower the potential of the bit lines BLj and $\overline{BLj}$ and the common data lines DB and $\overline{DB}$ to a level not greater than $\{Vcc_2 - V_T\}$, before the potential of the bit lines BLj and $\overline{BLj}$ is elevated. Therefore, the transistors $Q_{61}$ and $Q_{62}$ will be quickly turned on.

However, the conventional internal synchronous SRAM shown in FIG. 1 has one disadvantage. The internal synchronous SRAM shown in FIG. 1 is constructed such that the precharge of the bit lines BLj and $\overline{BLj}$ and the pull-down of the common data lines DB and $\overline{DB}$ are substantially concurrently performed. Accordingly, in the case that the voltage supply voltage does not almost vary, the potential of the bit lines BLj and $\overline{BLj}$ is caused to drop to a level further lower than a level sufficient to permit a quick turn-on of the selector. An excessive drop of the bit line potential is apt to break the data of the SRAM cells. This is contrary to the object of the precharge, namely the prevention of break of data stored in SRAM cells. In general, if the potential of the bit lines BLj and $\overline{BLj}$ drops to a half or less of the voltage supply voltage, the data of the SRAM cells is easily broken. This inclination becomes remarkable in the case that the voltage supply voltage itself is low.

Figure 3:
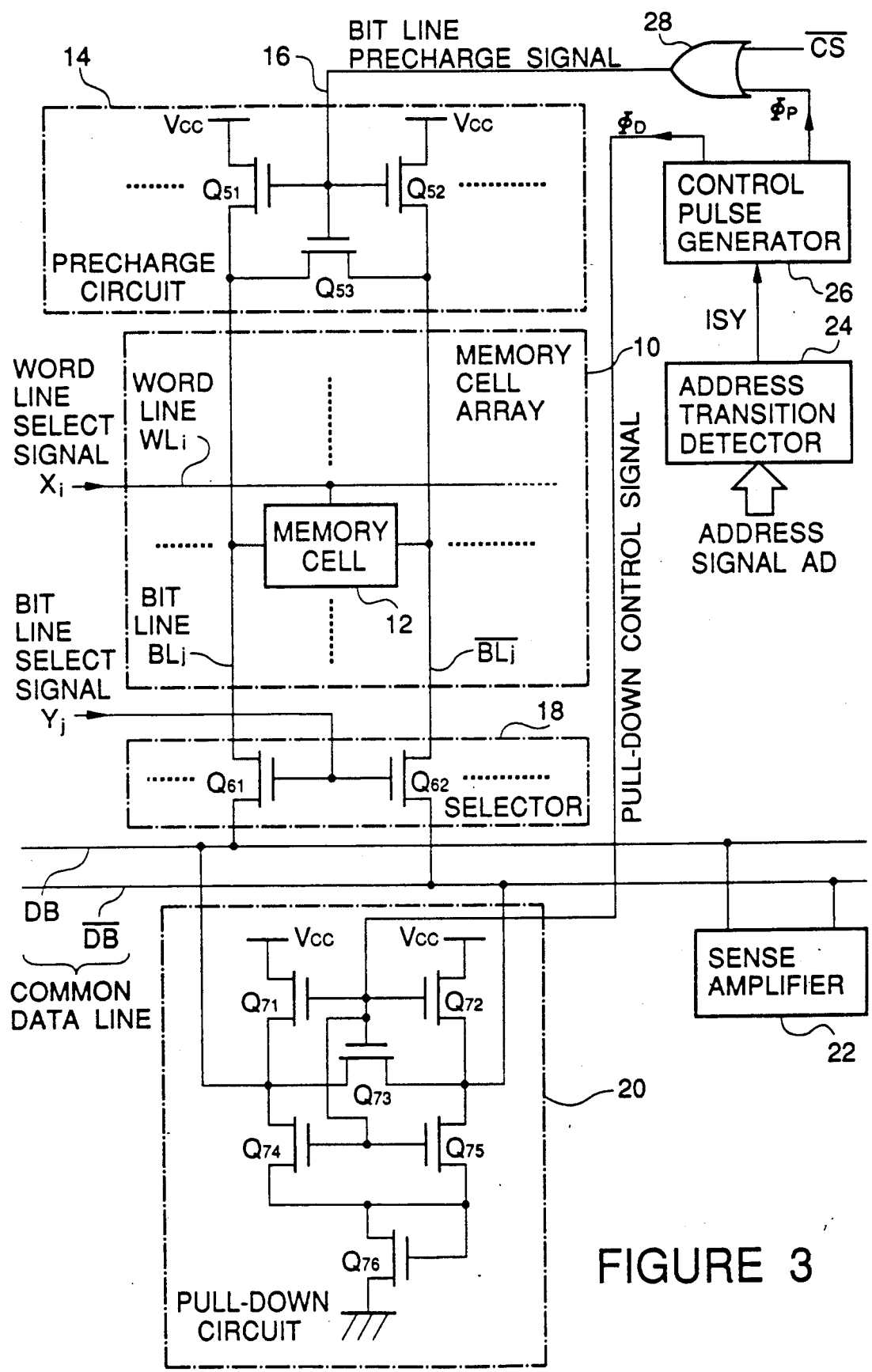
FIG. 3 is a block diagram of an embodiment of the internal synchronous SRAM in accordance with the present invention.

Turning to FIG. 3, there is shown a block diagram of an embodiment of the internal synchronous SRAM in accordance with the present invention. In FIG. 3, elements similar or corresponding to those shown in FIG. 1 are given the same Reference Numerals, and an explanation will be omitted.

As seen from comparison between FIGS. 1 and 3, the internal synchronous SRAM shown in FIG. 3 is such that the control pulse generator 26 generates a pull-down control signal $\phi_D$ and a bit line precharge signal $\phi p$ in response to the internal synchronous signal ISY. The pull-down control signal $\phi_D$ has a predetermined pulse width which rises up with a some degree of delay after each transition of the address signal AD and falls down sufficiently before a rising of the word line selecting signal Xi. On the other hand, the bit line precharge signal $\phi p$ has a leading edge rising substantially concurrently with a leading edge of the pull-down control signal $\phi_D$ and a tailing edge falling down sufficiently after the tailing edge of the pull-down control signal $\phi_D$ but before the rising of the word line selecting signal Xi.

With the above mentioned arrangement, the bit lines BLj and $\overline{BLj}$ are precharged at substantially the same time that the data line DB and $\overline{DB}$ are pulled down by the pull-down circuit 20, but this precharge of the bit lines BLj and $\overline{BLj}$ is maintained for a predetermined period of time after the pull-down is terminated.

Figure 4:
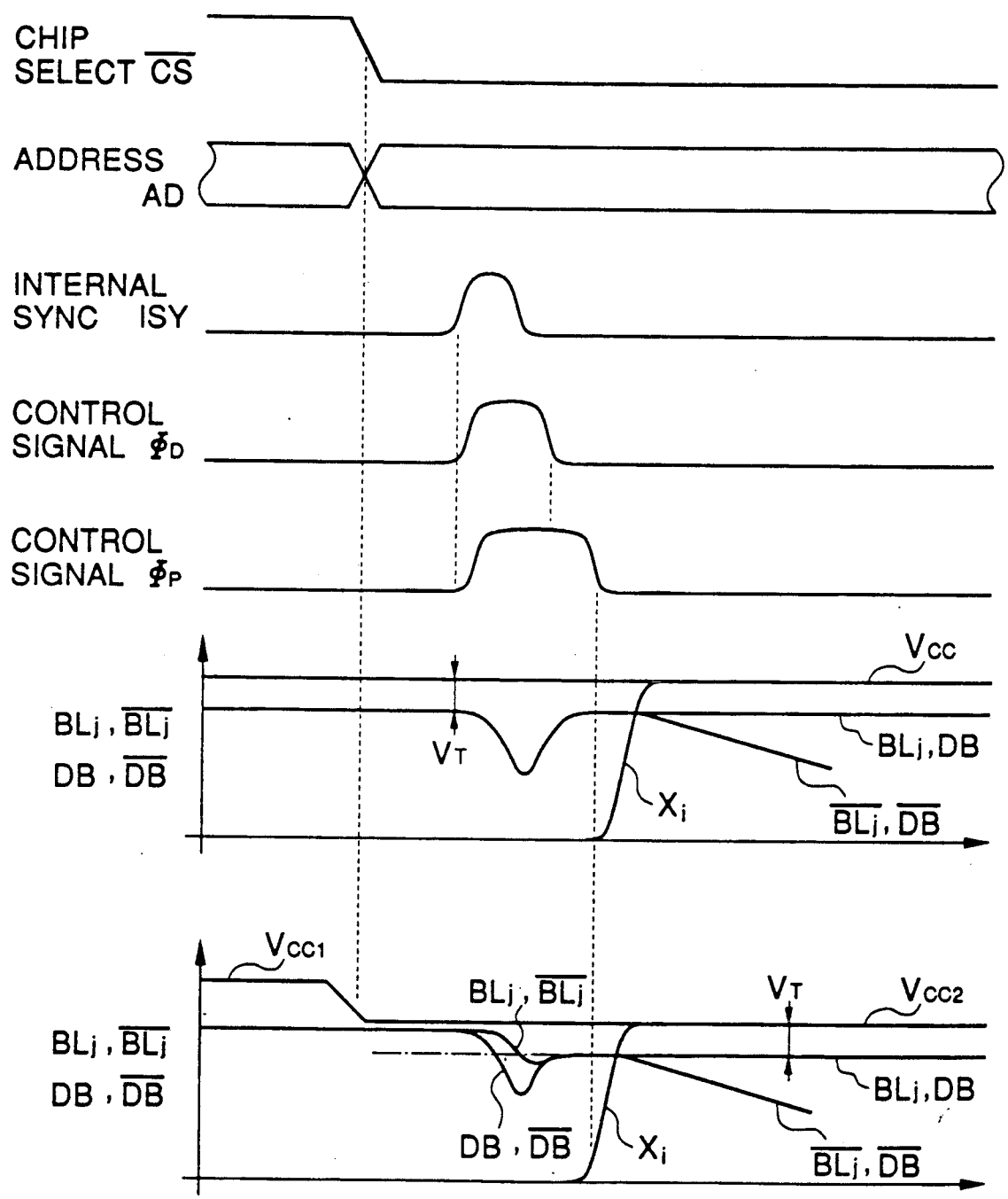
FIG. 4 is a waveform diagram illustrating an operation of the internal synchronous SRAM shown in FIG. 3.

Therefore, as shown in FIG. 4, the potential of the bit lines BLj and $\overline{BLj}$ is casued to drop once by action of the pull-down circuit 20, but is forced to rise again after the pull-down is terminated and before the rising of the word line selecting signal Xi. Therefore, it is possible to avoid a situation in which the potential of the bit lines BLj and $\overline{BLj}$ is too low which the word line selecting signal Xi is brought to the high level. Accordingly, the break of data of SRAM cells can be prevented.

In addition, it is possible to enlarge a capacity of the transistors used in the pull-down circuit 20. This is very effective in preventing an access delay and a reading malfunction occurring under variation of the voltage supply voltage.

The invention has thus been shown and described with reference to the specific embodiment. However, it should be noted that the present invention is in no way limited to the details of the illustrated structures but changes and modifications may be made within the scope of the appended claims.

I claim:

1. An internal synchronous SRAM comprising:
an address transition detector connected to receive an address signal for generating an internal synchronous signal in response to transition of the address signal;

a control pulse generator connected to receive the internal synchronous signal and operating to generate a pull-down control signal and a bit line precharge signal in response to the internal synchronous signal, the pull-down control signal having a predetermined pulse width and having a tailing edge before a rising of a word line selecting signal, and the bit line precharge signal having a leading edge substantially concurrent with a leading edge of the pull-down control signal and a tailing edge after the tailing edge of the pull-down control signal but before the rising of the word line selecting signal;

an SRAM cell array having a number of SRAM cells arranged in the form of a matrix, a plurality of word lines and a plurality of pairs of bit lines, one SRAM cell being located at each intersection between each word line and each pair of bit lines, each of the word lines being connected to receive a corresponding word line select signal;

a precharge circuit connected to all the bit lines and a voltage supply voltage and for precharging the bit lines in response to the bit line precharge signal during an active period of the bit line precharge signal;

a selector connected to all the bit lines and receiving a bit line select signal for connecting only a selected pair of bit lines to a pair of common data lines;

a pull-down circuit connected to the pair of common data lines and for pulling down the common data lines in response to the pull-down control signal during an active period of the pull-down control signal; and a sense amplifier connected to the common data lines for amplifying a data signal appearing on the common data lines, whereby the bit lines are precharged at substantially the same time as the common data lines are pulled down, and continuously precharged after completion of the pull-down of the common data lines, and the precharge of the bit lines is completed before the rising of the word line select signal.

2. An internal synchronous SRAM claimed in claim 1 further including an OR gate having a first input connected to receive a chip select signal and a second input connected to receive the bit line precharge signal outputted from the control pulse generator, an output of the OR gate being supplied to the precharge circuit as the bit line precharge signal so that the bit lines are precharged when the chip select signal is at a high level, and when the chip select signal is at a low level and the bit line precharge signal outputted from the control pulse generator is at a high level.

* * * * *

UNITED STATES PATENT AND TRADEMARK OFFICE
CERTIFICATE OF CORRECTION

PATENT NO.  : 5,047,984
DATED       : September 10, 1991
INVENTOR(S) : Junji Monden It is certified that error appears in the above-indentified patent and that said Letters Patent is hereby corrected as shown below:

Col. 5, line 29, delete "e,ovs/BLj/" and insert --BLj--.

Signed and Sealed this

Eighth Day of June, 1993

Attest:

MICHAEL K. KIRK

Attesting Officer

Acting Commissioner of Patents and Trademarks